(12) United States Patent
Kazumori

(10) Patent No.: US 8,076,642 B2
(45) Date of Patent: Dec. 13, 2011

(54) ELECTRON BEAM APPARATUS AND METHOD OF OPERATING THE SAME

(75) Inventor: Hiroyoshi Kazumori, Tokyo (JP)

(73) Assignee: JEOL Ltd., Tokyo (JP)

( * ) Notice: Subject to any disclaimer, the term of this patent is extended or adjusted under 35 U.S.C. 154(b) by 247 days.

(21) Appl. No.: 12/623,510

(22) Filed: Nov. 23, 2009

(65) Prior Publication Data

US 2010/0140471 A1    Jun. 10, 2010

(30) Foreign Application Priority Data

Dec. 10, 2008  (JP) ................ 2008-313904

(51) Int. Cl.
*H01J 37/28* (2006.01)
*H01J 37/244* (2006.01)

(52) U.S. Cl. .......... 250/310; 250/307; 250/396 R; 250/396 ML; 250/397

(58) Field of Classification Search .......... 250/310, 250/307, 396 R, 396 ML, 397, 398
See application file for complete search history.

(56) References Cited

U.S. PATENT DOCUMENTS

| | | | | |
|---|---|---|---|---|
| 4,896,036 A | * | 1/1990 | Rose et al. | 850/9 |
| 4,958,079 A | * | 9/1990 | Gray | 250/397 |
| 5,057,689 A | * | 10/1991 | Nomura et al. | 250/310 |
| 5,387,793 A | * | 2/1995 | Sato et al. | 250/310 |
| 5,831,265 A | * | 11/1998 | Shinkawa | 250/310 |
| 6,646,261 B2 | * | 11/2003 | Krans | 250/307 |
| 7,531,812 B2 | * | 5/2009 | Slowko | 250/397 |

FOREIGN PATENT DOCUMENTS

| | | |
|---|---|---|
| JP | A-07-240168 | 9/1995 |
| JP | A-09-171791 | 6/1997 |

* cited by examiner

*Primary Examiner* — Jack Berman
(74) *Attorney, Agent, or Firm* — The Webb Law Firm

(57) ABSTRACT

An electron beam apparatus is offered which can well detect backscattered electrons or both backscattered electrons and secondary electrons if an electron detector is disposed above an objective lens in the apparatus. The electron beam apparatus has an electron beam source for emitting an electron beam accelerated by a given accelerating voltage, the objective lens for focusing the electron beam emitted from the beam source onto a specimen, scan coils for scanning the focused beam over the specimen, and the electron detector located above the objective lens and provided with a hole permitting passage of the beam. The detector has an electrode for producing an electric field that attracts the electrons produced from the specimen in response to the electron beam irradiation. Correction coils for correcting deflection of the beam caused by the electric field are located below the detector.

9 Claims, 2 Drawing Sheets

ELECTRON BEAM APPARATUS AND METHOD OF OPERATING THE SAME

BACKGROUND OF THE INVENTION

1. Field of the Invention

The present invention relates to an electron beam apparatus, such as a scanning electron microscope, and to a method of operating the apparatus.

2. Description of Related Art

In a scanning electron microscope, a primary electron beam that is accelerated and released from an electron beam source, such as an electron gun, is brought to a focus by the lens action of an objective lens such that the diameter of the probe is reduced on a specimen surface. Under this condition, the beam is scanned in two dimensions across the specimen surface. As a result, electrons, such as secondary electrons and backscattered electrons, are produced from the specimen and detected as a signal.

A detector for detecting such electrons is located below or above the objective lens. The output signal from the detector representative of the detected electrons is amplified as an image signal and sent to an image-processing circuit. The image-processing circuit creates image data based on the signal. The image data is sent to a display having a display unit. The display displays a scanned image based on the image data.

In an apparatus where the detector is located above the objective lens, the detector is rarely placed on the axis of the primary electron beam. Usually, the detector is placed off the axis of the primary electron beam (see, for example, JP-A-7-240168). Electrons produced from the specimen and moved upward are deflected toward the detector such that the electrons are detected by the detector.

In another method, electrons produced from a specimen and moved upward are made to hit a reflective plate such that secondary electrons produced from the reflective plate are detected by a detector (see, for example, JP-A-9-171791).

Where the detector is disposed on the axis of the primary electron beam, the detector is made of a semiconductor device or has a scintillator.

In an electron beam apparatus where an electron detector is located above an objective lens, if the primary electron beam is accelerated by low accelerating voltages, it has been difficult to detect backscattered electrons produced from the specimen in response to irradiation by the primary electron beam. Furthermore, it has been difficult to detect both backscattered electrons and secondary electrons produced from the specimen.

SUMMARY OF THE INVENTION

In view of the foregoing, the present invention has been made. It is an object of the present invention to provide an electron beam apparatus which has an electron detector located above an objective lens but which can well detect backscattered electrons or both backscattered electrons and secondary electrons. It is another object of the present invention to provide a method of operating this electron beam apparatus.

It is a further object of the present invention to provide an electron beam apparatus which can prevent undesired deflection of the primary electron beam during the detection and thus can prevent deterioration of resolution. It is an additional object of the present invention to provide a method of operating this electron beam apparatus.

An electron beam apparatus according to one embodiment of the present invention has: an electron beam source for emitting an electron beam that is accelerated by a given accelerating voltage; an objective lens for focusing the electron beam emitted from the electron beam source onto a specimen; scan coils for scanning the focused beam over the specimen; and an electron detector placed above the objective lens and provided with a hole permitting passage of the electron beam. The electron detector has an electrode for producing an electric field that attracts electrons produced from the specimen in response to irradiation by the electron beam. Correction coils for correcting deflection of the electron beam caused by the electric field are located below the electron detector.

A method of operating an electron beam apparatus in accordance with one embodiment of the present invention is for use with the electron beam apparatus having: an electron beam source for emitting an electron beam that is accelerated by a given accelerating voltage; an objective lens for focusing the electron beam emitted from the electron beam source onto a specimen; scan coils for scanning the focused beam over the specimen; an electron detector placed above the objective lens and provided with a hole permitting passage of the electron beam; control circuit; an electrode mounted on the electron detector and acting to produce an electric field that attracts electrons produced from the specimen in response to irradiation by the electron beam; and correction coils located below the electron detector to correct deflection of the electron beam caused by the electric field. The method consists of causing the control circuit to vary a voltage applied to the electrode in step with the accelerating voltage of the electron beam.

In the present invention, the electrode for producing an electric field that attracts the electrons produced from the specimen in response to the irradiation by the primary electron beam is mounted on the electron detector located above the objective lens. The correction coils for correcting deflection of the electron beam caused by the electric field are mounted below the electron detector. The electrons to be detected (such as backscattered electrons and secondary electrons) reaching above the objective lens are attracted toward the electron detector by the action of the electric field produced by the electrode. Consequently, if the electron detector is located above the objective lens, the detector can detect the electrons efficiently.

Two modes of operation can be selected by adjusting the voltage applied to the electrode. In one mode, only backscattered electrons are detected by the electron detector. In the other mode, backscattered and secondary electrons are detected by the electron detector.

The primary electron beam may be deflected unnecessarily due to the action of the electric field produced by the electrode. The deflection of the primary electron beam can be corrected by the action of a magnetic field produced when the correction coils are excited. In consequence, the unnecessary deflection of the primary electron beam can be prevented. Hence, during observation, deterioration of resolution can be prevented.

Other features and advantages of the present invention will become apparent from the following more detailed description, taken in conjunction with the accompanying drawings, which illustrate, by way of example, the principles of the present invention.

DESCRIPTION OF THE PREFERRED EMBODIMENTS

Figure 1:
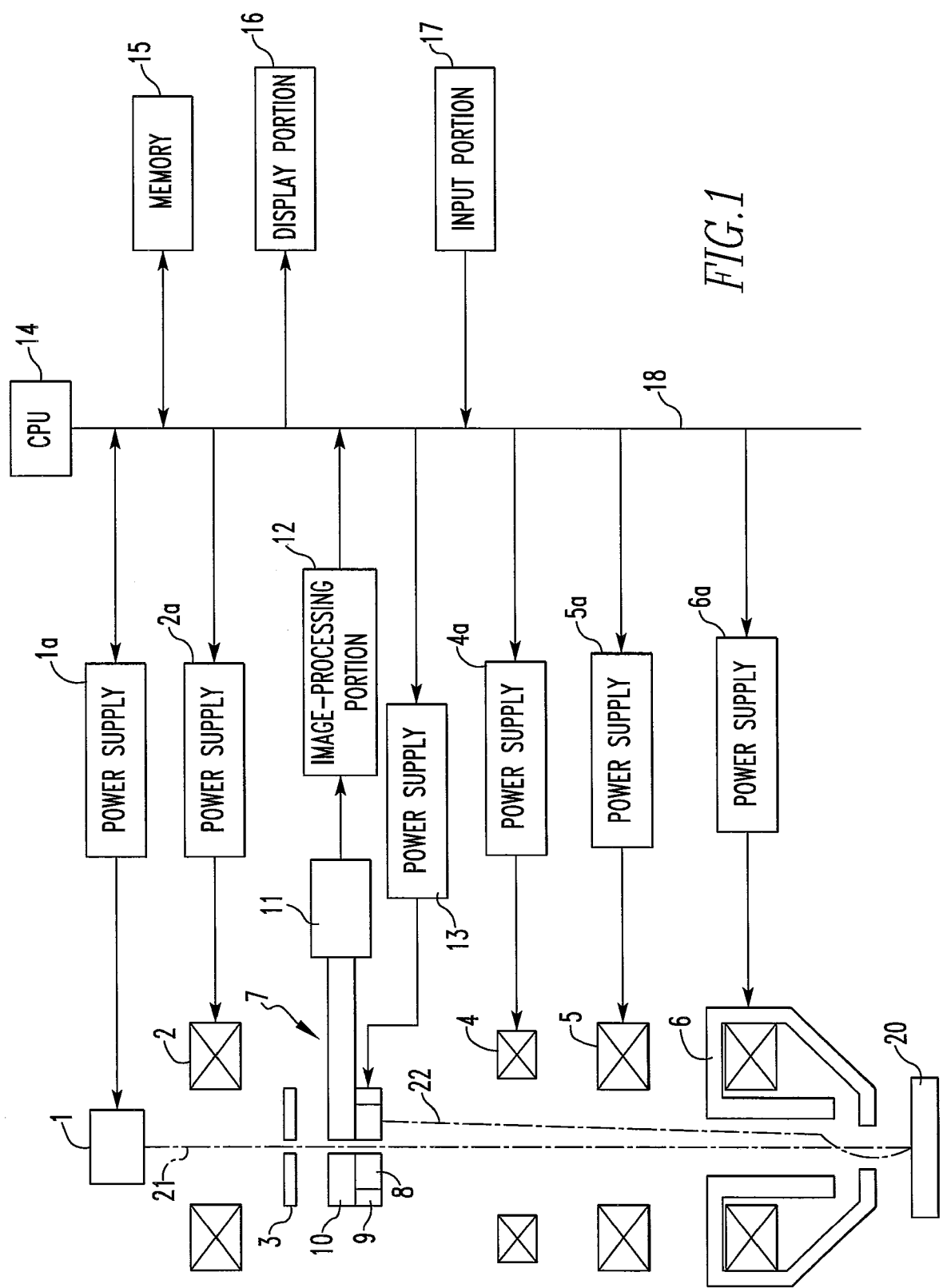
FIG. 1 is a schematic block diagram of an electron beam apparatus according to one embodiment of the present invention.

The present invention is hereinafter described in detail with reference to the drawings. FIG. 1 is a schematic block diagram of an electron beam apparatus according to one embodiment of the present invention. This apparatus has the structure of a scanning electron microscope.

The electron beam apparatus has an electron beam source 1 consisting of an electron gun. The beam source 1 emits an electron beam (primary electron beam) 21 toward a specimen 20, the beam being accelerated by a given accelerating voltage. The beam 21 emitted from the electron beam source 1 in this way is focused by a condenser lens 2 and passes through a through-hole in an objective aperture 3.

The electron beam 21 passed through the hole in the objective aperture 3 passes through a through-hole in an electron detector 7 located below (on the downstream side of) the aperture 3. Then, the beam 21 impinges on an objective lens 6 through correction coils 4 and scan coils 5.

The front end of the objective lens 6 faces the specimen 20. The beam 21 passed through the objective lens 6 is focused by a magnetic field produced by the objective lens 6. The beam hits the specimen 20 while focused at the specimen 20. The beam 21 focused in this way is scanned over the specimen 20 by the deflecting action of the scan coils 5.

Electrons 22 to be detected (such as backscattered electrons and secondary electrons) are produced from the specimen 20 hit by the electron beam 21. The electrons 22 are captured by the magnetic field produced by the objective lens 6 or by an electric field attached to the magnetic field and move upward through the objective lens 6.

The electrons 22 moved upward in this way reach the detector 7. The detector 7 has a scintillator 8 located on a side of the specimen 20, an annular electrode 9 located around the scintillator 8, and a light guide 10 supporting the scintillator 8 and electrode 9. The scintillator 8 and light guide 10 are provided with the aforementioned holes permitting passage of the electron beam 21.

The electron beam source 1 is supplied with electric power from an energization power supply 1a to energize the beam source. As a result, the electron beam 21 accelerated by the given accelerating voltage is released from the electron beam source 1.

The condenser lens 2 is supplied with an excitation current from an excitation power supply 2a to excite the condenser lens 2. The lens 2 produces a magnetic field that brings the electron beam 21 into a focus at the position of the objective aperture 3.

The correction coils 4 are supplied with an excitation current from an excitation power supply 4a to excite the coils 4. The coils 4 produce a magnetic field that corrects the axis of the primary electron beam 21.

The scan coils 5 are supplied with excitation currents from an excitation power supply 5a to excite the scan coils 5. The coils 5 produce a magnetic field which appropriately deflects the electron beam 21 and which scans the beam 21 over the specimen 20.

The objective lens 6 is supplied with an excitation current from an excitation power supply 6a to excite the lens 6. The objective lens 6 produces a magnetic field that sharply focuses the electron beam 21 on the specimen 20.

These excitation power supplies are controlled by a CPU 14 via a bus line 18. A memory 15 is connected with the bus line 18 coupled to the CPU 14 such that the memory can be read and written.

A display portion 16 consisting, for example, of a liquid crystal display (LCD) and an input portion 17 including a keyboard and a pointing device (such as a mouse) are connected with the bus line 18.

A given voltage is applied to the electrode 9 of the detector 7 from a power supply 13, which is controlled by the CPU 14 via the bus line 18.

When the electrons 22 to be detected arrive at the scintillator 8 of the detector 7, scintillation light is produced and guided to a photomultiplier tube 11 through the light guide 10.

The output signal from the photomultiplier tube 11 responsive to the scintillation light is amplified and then sent to an image-processing portion 12. The image-processing portion 12 creates image data based on the amplified signal. The image data is sent to the display portion 16 via the bus line 18. An image based on the image data is displayed as a scanned image on the display portion 16.

The CPU 14 controls the operation of the excitation power supplies, power supply 13, image-processing portion 12, memory 15, and display portion 16.

In operation of the electron beam apparatus according to the present invention, the accelerated electron beam 21 released from the electron beam source 1 is sharply focused onto the specimen 20 by excitation of the condenser lens 2 and objective lens 6. At this time, the electron beam 21 is deflected and scanned over the specimen 20 by operation of the scan coils 5.

The electrons 22 to be detected (such as backscattered electrons and secondary electrons) are produced from the specimen 20 in response to the irradiation by the electron beam 21. The produced electrons 22 having different energies follow different trajectories in moving upward through the objective lens 6. Finally, the electrons 22 to be detected reach the scintillator 8 of the detector 7.

The collision energy of the electrons 22 impinging on the scintillator 8 is different depending on the accelerating voltage of the primary electron beam 21 and on the electric field in the space where the detector 7 is located.

In the present electron beam apparatus, the outer wall surfaces of at least the correction coils 4, scan coils 5, and objective lens 6 are put at ground potential. Consequently, any electric field other than the electric field produced by the electrode 9 of the detector 7 does not exist in the space extending from the specimen 20 to a point located immediately ahead of the scintillator 8 of the detector 7.

The scintillator 8 is made of a fluorescent material. As the energy of the electrons 22 colliding against the scintillator 8 is increased, the amount of emitted light increases. Usually, in the case of the scintillator used in the detector of a scanning electron microscope, if the energy of the electrons colliding against the scintillator is below 1 keV, the scintillator little scintillates.

Accordingly, in the electron beam apparatus according to the present invention, the detector 7 has the annular electrode 9 for producing an electric field that accelerates the electrons 22 from the specimen 20 to cause them to hit the scintillator 8.

Where the electron beam 21 is made to pass through the hole in the detector 7 located above the objective lens 6 as in the present invention, if the voltage applied to the electrode 9 is increased excessively, high-voltage discharging may be produced. In addition, the electron beam 21 may be adversely affected. Therefore, the voltage applied to the electrode 9 needs to be controlled at least in such a way that the electrons 22 detected by the detector 7 produce a sufficient amount of signal without producing high-voltage discharging.

Depending on the accelerating voltage of the electron beam 21, it is possible to set the voltage applied to the electrode 9 to an extremely low level to prevent the secondary electrons from the specimen 20 from reaching the scintillator 8; only backscattered electrons of the electrons 22 to be detected are permitted to reach the scintillator 8. A scanned image or backscattered electron image based on the backscattered electrons from the specimen 20 contains compositional information and crystallographic information about the specimen 20. The image provides useful analytical data.

The scintillation light produced from the detector 7 in response to the electrons 22 incident on the scintillator 8 is sent to the photomultiplier tube 11. The tube 11 outputs an electrical signal responsive to the scintillation light. The electrical signal is amplified and then sent to the image-processing portion 12.

The image-processing portion 12 creates image data based on the amplified signal. The image data is sent to the display portion 16 via the bus line 18. An image based on the image data is displayed as an image of the specimen on the display portion 16.

As described previously, when a voltage is applied to the electrode 9 of the detector 7, an electric field is produced. This field will to some extent deflect the electron beam 21 passing through the hole in the detector 7 because the electron beam 21 does not always precisely pass through the center of the annular electrode 9 depending on the state in which the detector 7 is installed. In this case, the axis of the beam 21 incident on the objective lens 6 will deviate, producing off-axis aberration and astigmatism in the beam 21.

In order to reduce the axial deviation of the electron beam 21 incident on the objective lens 6, an excitation current is supplied to the correction coils 4 from the excitation power supply 4a, exciting the coils 4. The excitation current is set by the CPU 14 so as to vary in step with the voltage applied to the electrode 9 of the detector 7.

In particular, the CPU 14 controls the excitation power supply 1a supplying excitation electric power to the electron beam source 1 to set the accelerating voltage of the electron beam 21 emitted from the electron beam source 1 to a given voltage. Furthermore, the CPU controls the power supply 13 such that an optimized voltage is applied to the electrode 9 of the detector 7 in step with the accelerating voltage. At the same time, the CPU 14 controls the excitation power supply 4a such that an axial-correction excitation current varied in step with the applied voltage is supplied to the correction coils 4.

Data about the voltage applied to the electrode 9 responsive to the accelerating voltage of the electron beam 21, data about the excitation current supplied to the correction coils responsive to the applied voltage, and other data are stored in the memory 15. The CPU 14 reads these kinds of data from the memory 15 and controls the power supplies.

In case (1), only backscattered electrons are detected as the electrons 22 by the detector 7. When the accelerating voltage of the electron beam 21 is 0.5 kV, a voltage of 2.5 kV is applied to the electrode 9 of the detector 7. When the accelerating voltage is 1 kV, a voltage of 2 kV is applied to the electrode 9. When the accelerating voltage is 1.5 kV, a voltage of 1.5 kV is applied to the electrode 9. When the accelerating voltage is 2 kV, a voltage of 1 kV is applied to the electrode 9. When the accelerating voltage is 2.5 kV, a voltage of 0.5 kV is applied to the electrode 9. When the accelerating voltage is 3 kV, a voltage of 0 kV is applied to the electrode 9.

In case (2), electrons 22 including both secondary electrons and backscattered electrons are detected by the detector 7. As an example, when the accelerating voltage of the electron beam 21 is 0.5 to 3 kV, a voltage of 10 kV is applied to the electrode 9 of the detector 7. Data about these values of the applied voltage is stored in the memory 15 for each of the two cases (1) and (2).

With respect to data about the excitation current supplied to the correction coils 4, each value of the accelerating voltage of the electron beam 21 varying in step with the voltage applied to the electrode 9 of the detector 7 is stored in the memory 15. In the present invention, the excitation current is increased with increasing the applied voltage at a given accelerating voltage.

As the applied voltage is increased, the electric field produced by the electrode 9 becomes more intense. The electron beam 21 incident on the objective lens 6 is deflected to a greater extent. Therefore, the excitation of the correction coils 4 for correcting the amount of deflection needs to be increased.

In the above embodiment, the detector 7 and correction coils 4 are positioned above the scan coils 5. However, the present invention is not limited to this geometry.

Figure 2:
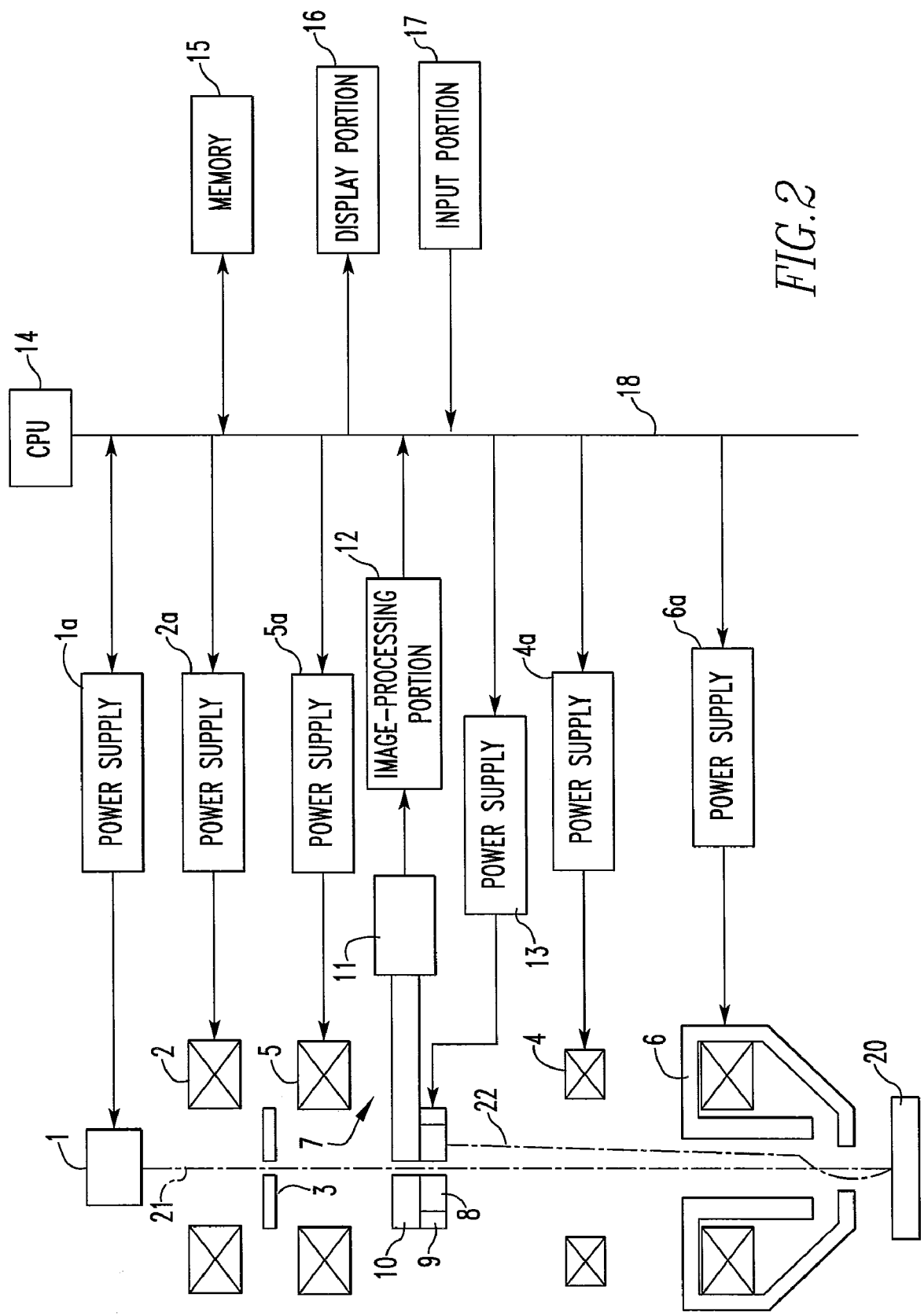
FIG. 2 is a schematic block diagram of a modification of the apparatus shown in FIG. 1.

FIG. 2 shows a modified embodiment of the present invention. In this modified embodiment, the detector 7 and correction coils 4 are disposed between a set of scan coils 5 and the objective lens 6. This modified embodiment yields the same advantages as the foregoing embodiment.

In this way, the electron beam apparatus, according to the present invention, has the electron beam source 1 emitting the electron beam 21 accelerated by the given accelerating voltage, the objective lens 6 for focusing the beam 21 emitted from the electron beam source 1 onto the specimen 20, the scan coils 5 for scanning the focused beam 21 over the specimen 20, and the electron detector 7 provided with the hole permitting passage of the beam 21, the detector 7 being located above the objective lens 6. The detector 7 has the electrode 9 for producing the electric field that attracts the electrons 22 produced from the specimen 20 in response to the irradiation by the beam 21. The correction coils 4 for correcting deflection of the beam 21 caused by the electric field are mounted below the detector 7.

The method of operating an electron beam apparatus, in accordance with the present invention, is for use with the electron beam apparatus having the electron beam source 1 emitting the electron beam 21 accelerated by the given accelerating voltage, the objective lens 6 for focusing the beam 21 emitted from the electron beam source 1 onto the specimen 20, the scan coils 5 for scanning the focused beam 21 over the specimen 20, the electron detector 7 provided with the hole permitting passage of the beam 21, the detector 7 being located above the objective lens 6, and the control CPU 14. The detector 7 has the electrode 9 for producing the electric field that attracts the electrons 22 produced from the specimen 20 in response to irradiation by the electron beam 21. The correction coils 4 for correcting deflection of the beam 21 caused by the electric field are mounted below the detector 7. The method consists of causing the CPU 14 to vary the voltage applied to the electrode 9 in step with the accelerating voltage of the electron beam 21.

At this time, the current supplied to the correction coils 4 can be made to vary in step with the voltage applied to the electrode 9.

As shown in FIG. 1, the electron detector 7 can be installed above the scan coils 5. The correction coils 4 can be installed between the detector 7 and the set of scan coils 5.

As shown in FIG. 2, the electron detector 7 can be installed below the scan coils 5. The correction coils 4 can be installed between the detector 7 and the objective lens 6.

In the present invention, electrons 22 including only backscattered electrons or both secondary electrons and backscattered electrons can be detected efficiently, if the primary electron beam 21 passes through the hole in the electron detector 7, because the apparatus includes the aforementioned structure and because the electrode 9 is disposed on the electron detector 7.

Where only backscattered electrons are detected as the electrons 22 and a backscattered electron image is obtained, good backscattered electron images can be acquired at low accelerating voltages by increasing the voltage applied to the electrode 9 with reducing the accelerating voltage of the electron beam 21.

When the accelerating voltage of the electron beam 21 is high, good backscattered electron images can be obtained at high accelerating voltages by setting low the voltage applied to the electrode 9.

The ratio between the amount of secondary electrons and the amount of backscattered electrons included in the detected electrons 22 can be appropriately adjusted by adjusting the voltage applied to the electrode 9.

Secondary electrons affected by the accelerating field when going out of the specimen 20 can be selected and discarded by setting the applied voltage to a positive or negative value according to the accelerating voltage of the electron beam 21.

If the axis of the electron beam 21 incident on the objective lens 6 is shifted due to variation of the applied voltage, the provision of the correction coils 4 makes it possible to return the axis to its optimum state.

Having thus described my invention with the detail and particularity required by the Patent Laws, what is desired protected by Letters Patent is set forth in the following claims.

The invention claimed is:

1. An electron beam apparatus comprising:
   an electron beam source for emitting an electron beam that is accelerated by a given accelerating voltage;
   an objective lens for focusing the electron beam emitted from the electron beam source onto a specimen;
   scan coils for scanning the focused electron beam over the specimen; and
   an electron detector placed above the objective lens and provided with a hole permitting passage of the electron beam,
   wherein the electron detector has an electrode for producing an electric field that attracts electrons produced from the specimen in response to irradiation by the electron beam, and
   wherein correction coils for correcting deflection of the electron beam caused by the electric field are located below the electron detector.

2. An electron beam apparatus as set forth in claim 1, wherein a voltage applied to the electrode is varied in step with the accelerating voltage of the electron beam.

3. An electron beam apparatus as set forth in claim 2, wherein an electrical current supplied to the correction coils is varied in step with the voltage applied to the electrode.

4. An electron beam apparatus as set forth in any one of claim 1, 2, or 3, wherein the electron detector is located above the scan coils, and wherein the correction coils are located between the electron detector and the set of scan coils.

5. An electron beam apparatus as set forth in any one of claim 1, 2, or 3, wherein the electron detector is located below the scan coils, and wherein the correction coils are located between the electron detector and the objective lens.

6. A method of operating an electron beam apparatus having:
   an electron beam source for emitting an electron beam that is accelerated by a given accelerating voltage;
   an objective lens for focusing the electron beam emitted from the electron beam source onto a specimen;
   scan coils for scanning the focused electron beam over the specimen;
   an electron detector placed above the objective lens and provided with a hole permitting passage of the electron beam;
   control means;
   an electrode mounted on the electron detector and acting to produce an electric field that attracts electrons produced from the specimen in response to irradiation by the electron beam; and
   correction coils located below the electron detector to correct deflection of the electron beam caused by the electric field,
   said method comprising the step of causing the control means to vary a voltage applied to the electrode in step with the accelerating voltage of the electron beam.

7. A method of operating an electron beam apparatus as set forth in claim 6, wherein the control means causes an electrical current supplied to the correction coils to be varied in step with the accelerating voltage of the electron beam.

8. A method of operating an electron beam apparatus as set forth in claim 6 or 7, wherein the electron detector of the electron beam apparatus is located above the scan coils, and wherein the correction coils are located between the electron detector and the set of scan coils.

9. A method of operating an electron beam apparatus as set forth in claim 6 or 7, wherein the electron detector of the electron beam apparatus is located below the scan coils, and wherein the correction coils are located between the electron detector and the objective lens.

* * * * *